United States Patent
Rudmann et al.

(10) Patent No.: US 10,444,477 B2
(45) Date of Patent: Oct. 15, 2019

(54) WAFER-LEVEL FABRICATION OF OPTICAL DEVICES WITH FRONT FOCAL LENGTH CORRECTION

(75) Inventors: Hartmut Rudmann, Jona (CH); Matthias Maluck, Zug (CH); Alexander Bietsch, Thalwil (CH); Peter Roentgen, Thalwil (CH); Stephan Heimgartner, Aarau Rohr (CH)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 289 days.

(21) Appl. No.: 14/239,362

(22) PCT Filed: Aug. 24, 2012

(86) PCT No.: PCT/CH2012/000201
§ 371 (c)(1),
(2), (4) Date: Jun. 6, 2014

(87) PCT Pub. No.: WO2013/026175
PCT Pub. Date: Feb. 28, 2013

(65) Prior Publication Data
US 2014/0299587 A1    Oct. 9, 2014

Related U.S. Application Data

(60) Provisional application No. 61/527,355, filed on Aug. 25, 2011.

(51) Int. Cl.
*G02B 13/00* (2006.01)
*B23K 26/36* (2014.01)
(Continued)

(52) U.S. Cl.
CPC ........ *G02B 13/0085* (2013.01); *B23K 26/361* (2015.10); *G01J 1/42* (2013.01);
(Continued)

(58) Field of Classification Search
CPC ............ B23K 26/362; H01L 27/14618; H01L 27/14625; H01L 27/14683; H01L 22/10;
(Continued)

(56) References Cited

U.S. PATENT DOCUMENTS

| | | | |
|---|---|---|---|
| 5,232,549 A | * | 8/1993 | Cathey .................. G03F 7/0007 216/20 |
| 6,530,826 B2 | * | 3/2003 | Wenski ............. H01L 21/02024 257/E21.23 |

(Continued)

FOREIGN PATENT DOCUMENTS

| | | |
|---|---|---|
| CN | 101009779 | 8/2007 |
| CN | 101107761 | 1/2008 |

(Continued)

OTHER PUBLICATIONS

European Patent Office, International Search Report for International Patent Application No. PCT/CH2012/000201 (dated Jan. 31, 2013).

*Primary Examiner* — Ibrahime A Abraham
*Assistant Examiner* — Justin C Dodson
(74) *Attorney, Agent, or Firm* — Michael Best & Friedrich LLP (57) ABSTRACT

The wafer stack (100) comprises a first wafer (OW1) referred to as optics wafer and a second wafer (SW) referred to as spacer wafer, said optics wafer (OW1) having manufacturing irregularities. The spacer wafer (SW) is structured such that it at least partially compensates for said manufacturing irregularities. The corresponding method for manufacturing a device, which in particular can be an optical device, comprises carrying out a correction step for at least partially compensating for manufacturing irregularities. Such a correction step comprises providing a wafer (SW) referred to as spacer wafer, wherein that spacer wafer is structured for at least partially compensating for said manufacturing irregularities. Those manufacturing irregularities may comprise a deviation from a nominal value, e.g., a irregularities in focal length. The invention can allow to mass produce high-precision devices at a high yield.

39 Claims, 4 Drawing Sheets

(51) Int. Cl.
*H01L 27/146* (2006.01)
*G01J 1/42* (2006.01)
*B23K 26/361* (2014.01)

(52) U.S. Cl.
CPC .. *H01L 27/14618* (2013.01); *H01L 27/14625* (2013.01); *H01L 27/14683* (2013.01); *H01L 2924/0002* (2013.01); *Y10T 29/49748* (2015.01); *Y10T 83/04* (2015.04)

(58) Field of Classification Search
CPC ... G02B 13/0085; Y10T 156/11; B23B 38/10; B23B 38/105; B81C 1/00317; B81C 1/00357; B81C 2203/0163; B81C 2203/054
USPC ............ 219/121.67–121.69, 121.71–121.72; 451/28; 216/94, 24, 59, 84; 438/15, 26; 156/701
See application file for complete search history.

(56) References Cited

U.S. PATENT DOCUMENTS

| | | | | |
|---|---|---|---|---|
| 6,836,612 | B2* | 12/2004 | Morris | G02B 3/0012 359/619 |
| 2007/0062920 | A1* | 3/2007 | Shin | B23P 25/006 219/121.72 |
| 2008/0115512 | A1 | 5/2008 | Rizzo | |
| 2008/0230934 | A1 | 9/2008 | Rudmann et al. | |
| 2009/0159200 | A1* | 6/2009 | Rossi | H01L 27/14683 156/292 |
| 2009/0290833 | A1* | 11/2009 | Han | G02B 3/0031 385/14 |
| 2011/0032409 | A1 | 2/2011 | Rossi et al. | |
| 2011/0043923 | A1* | 2/2011 | Rossi | B29D 11/00375 359/642 |
| 2011/0069395 | A1* | 3/2011 | Lin | H01L 27/14625 359/619 |
| 2011/0181854 | A1* | 7/2011 | Ovrutsky | G03B 17/02 355/55 |
| 2012/0075519 | A1 | 3/2012 | Blasch | |

FOREIGN PATENT DOCUMENTS

| | | |
|---|---|---|
| JP | 2005-539276 | 12/2005 |
| TW | 200935525 | 8/2009 |
| TW | 200947007 | 11/2009 |
| TW | 201115205 | 5/2011 |
| WO | WO 2009/102602 | 8/2009 |
| WO | 2010/074743 | 7/2010 |
| WO | 2010/074743 A1 | 7/2010 |
| WO | 2011/049635 | 4/2011 |
| WO | WO 2011/063347 | 5/2011 |
| WO | 2011/156928 | 12/2011 |

* cited by examiner

WAFER-LEVEL FABRICATION OF OPTICAL DEVICES WITH FRONT FOCAL LENGTH CORRECTION

TECHNICAL FIELD

The invention relates to the field of optics, more particularly micro-optics. In particular, it relates to wafer-level fabrication of optical devices such as optical systems, opto-electronic modules and cameras. It relates to methods and apparatuses according to the opening clauses of the claims.

BACKGROUND OF THE INVENTION

From the international patent application published as WO 2011/156928 A2 (filed on Jun. 10, 2011), cameras and optical modules for cameras are known, which can be fabricated on wafer level. Therein, cameras and optical modules for cameras as well as methods for manufacturing the same are disclosed in some detail. Therefore, that patent application WO 2011/156928 A2 is hereby incorporated by reference in the present patent application.

DEFINITION OF TERMS

"Active optical component": A light sensing or a light emitting component. E.g., a photodiode, an image sensor, an LED, an OLED, a laser chip.

"Passive optical component": An optical component redirecting light by refraction and/or diffraction and/or reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have opening or holes, and a wafer may even be free of material in a predominant portion of its lateral area. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

SUMMARY OF THE INVENTION

One object of the invention is to provide an alternative way of manufacturing devices, in particular optical devices, such as optical systems, opto-electronic modules and cameras, and in particular to provide an improved way of manufacturing devices, in particular optical devices, such as optical systems, opto-electronic modules and cameras. Furthermore, corresponding devices, in particular optical devices such as optical systems, opto-electronic modules and cameras, as well as related devices and apparatuses such as wafers and wafer stacks shall be provided.

Another object of the invention is to improve the manufacturing yield in the manufacture of optical devices such as optical systems, opto-electronic modules and cameras.

Another object of the invention is to achieve an improved quality of optical devices such as optical systems, opto-electronic modules and cameras, in particular when these are manufactured on wafer-scale.

Further objects emerge from the description and embodiments below.

At least one of these objects is at least partially achieved by apparatuses and methods according to the patent claims and/or by the below-described apparatuses and methods. The invention relates in particular to devices (in particular optical devices) and to their manufacture, as well as to wafers (spacer wafers) and wafer stacks (comprising a spacer wafer and an optics wafer) used during the manufacture of optical devices. The device usually comprises at least one optics member comprising usually at least one active optical component and/or at least one passive optical component. The manufacture usually involves wafer-scale manufacturing steps.

During the manufacture of devices, in particular optical devices, manufacturing irregularities or manufacturing deviations may occur, e.g., simply, because of more or less unavoidable variations or inaccuracies in one or more of the process steps. E.g., when the device comprises at least one lens element, a multitude of such lens elements on a wafer (referred to as optics wafer), in reality, has (slightly) varying focal lengths despite of having nominally the same focal length.

The inventors have found that it is possible to at least partially correct or compensate for manufacturing irregularities on wafer level, thus achieving an improved yield and/or improved optical properties of the devices.

A spacer wafer compensating—on wafer level—for such manufacturing irregularities is suggested. More particularly, the shape of the spacer wafer, in particular its thickness (vertical extension) or thickness distribution (distribution of vertical extensions, laterally across the spacer wafer) can be chosen in such a way that said manufacturing irregularities are at least partially compensated for. And it may, alternatively or additionally, be provided that other properties of the spacer contribute to the sought compensation, e.g., the choice of materials and/or thicknesses (vertical extensions) of materials such as of transparent material in light channels formed by the spacer wafer. Note that the proposed wafer referred to as spacer wafer may comprise passive optical components.

As it turned out, in some cases, said manufacturing irregularities are, to a certain extent, reproduceable or reproduce themselves when carrying out a manufacturing step repeatedly. In such cases, it can be of advantage to use a spacer wafer for (at least partially) compensating for the manufacturing irregularities which is manufactured using replication. Other manufacturing irregularities seem to not show a predictable behavior. In such cases, it can be helpful to carry out measurements at the optics wafer which again allows to choose or manufacture a spacer wafer suitable for at least partially compensating for the manufacturing irregularities.

There are three sub-aspects to the invention:

In a first sub-aspect, an average value of said manufacturing irregularities (across the optics wafer) is determined, e.g., based on sampling measurements, and a spacer wafer having a thickness (vertical extension) chosen in dependence of that average value is used. That spacer wafer may be selected from a plurality of pre-fabricated spacer wafers or may be manufactured accordingly. In this first aspect, usually, trends possibly existing in the (lateral) distribution of the manufacturing irregularities are neglected.

In a second sub-aspect, such trends are made use of. E.g., based on measurements carried out at an optics wafer, a suitable spacer wafer is used, e.g., a spacer wafer having a general tilt.

In a third sub-aspect, it is suggested to use a spacer wafer having a multitude of regions in which the thickness (vertical extension) of the spacer wafer has an individual value. E.g., for each of a multitude of optics members comprised in an optics wafer, a value related to said manufacturing irregularities is determined, and the spacer wafer has a multitude of regions, each associated with one of said optics members, and the thickness (vertical extension) in each of said regions is related to and/or chosen in dependence of the value determined for the respective associated optics member.

The third sub-aspect can, e.g., be realized by comprising manufacturing a spacer wafer using a replication step, wherein a replication master is used which already takes into account the manufacturing irregularities. Accordingly, a spacer wafer obtained using such a replication master can, at least to some extent, compensate for the manufacturing irregularities. The design of the replication master can be determined based on the (specific) optics wafer whose manufacturing irregularities shall be compensated for by the spacer wafer or on a further optics wafer which has been manufactured in the same way (or on several such further optics wafers). This is particularly interesting if also the manufacture of the optics wafer comprises a replication step; and this can result in a generation of a pair of matched replication masters, one for the manufacture of optics wafers and one for the manufacture of spacer wafers, whereby wafer pairs comprising an optics wafer and a spacer wafer can be obtained which match particularly well resulting in a high production yield and/or in particularly high quality devices.

Another way of realizing the third sub-aspect comprises locally removing material from or adding material to the spacer wafer, e.g., by milling. For increased production speed, one spacer wafer can simultaneously be processed in a plurality of locations.

The third sub-aspect can also be realized combining the two possibilities described before, namely using a spacer wafer manufactured using replication using a replication master already taking into account the manufacturing irregularities, and then locally removing or adding material, the latter so-to-speak as a fine-tuning step, usually based on (further) measurements for determining the amount of manufacturing irregularities not yet compensated for by the replication-obtained spacer wafer.

If the spacer wafer comprises a multitude of light channels, each associated with one of a multitude of optics members of said optics wafer, the length of that light channel can be used as a magnitude for at least partially compensating for said manufacturing irregularities. With respect to the sub-aspects described above, this can mean, e.g., that with respect to the first sub-aspect, for all of said light channels, the length of said light channels amounts to a value at least approximately compensating for manufacturing irregularities amounting to the before-mentioned average value;

with respect to the second sub-aspect, the lateral distribution of lengths of said light channels across the spacer wafer is chosen such that it is describable by a mathematical function, said mathematical function being derivable from a fitting function fitting a mathematical function describing the lateral distribution of said manufacturing irregularities;

with respect to the third sub-aspect, the length of each of said light channels amounts to a value related to and/or chosen in dependence of the value determined for the manufacturing irregularities of the respective associated optics member.

Irrespective of said sub-aspects, the invention can comprise a separating step, more particularly a separating step by means of which said spacer wafer and said optics wafer—which usually are constituents of a wafer stack—are separated into a multitude of modules, more particularly separated into a multitude of modules comprising one optics member each.

Furthermore, it can generally be provided that the light channels are openings extending vertically across the spacer wafer, e.g., are through-holes. But it can also be provided that in the light channels (or in at least one of them), transparent material is present, and the light channels may be surrounded by non-transparent material. The transparent material may completely or partially fill light channels. Providing amounts individually adjusted for the channels may contribute to compensating for said manufacturing irregularities, e.g., as one of two measures (or provisions or steps) for accomplishing a sought compensation, e.g., as a fine-tuning step.

In particular, the following embodiments can, at least in a specific view onto the invention, be characteristic for the invention:

A Method:

The method is a method for manufacturing a device, in particular an optical device. The method comprises carrying out a correction step for at least partially compensating for manufacturing irregularities, said correction step comprising providing a wafer referred to as spacer wafer, said spacer wafer being structured for at least partially compensating for said manufacturing irregularities. In particular, said manufacturing irregularities may comprise a deviation from a nominal value. More specifically, said manufacturing irregularities may comprise dimensional irregularities of a constituent of said device.

It can furthermore be provided that said device comprises an optics member, and more specifically, said optics member may comprises at least one passive optical component and/or at least one active optical component.

In one embodiment, the method comprises the step of manufacturing said spacer wafer. In this case, said manufacturing said spacer wafer will typically be carried out in dependence of said manufacturing irregularities.

In one embodiment which may be combined with the before-addressed embodiment, the method comprises the step of selecting said spacer wafer from a plurality of pre-fabricated spacer wafers. In particular, it may be provided that said pre-fabricated wafers are manufactured according to different specifications, more particularly wherein said pre-fabricated spacer wafers differ from each other in their vertical extensions. This is a relatively simple way of accomplishing the sought compensation (first sub-aspect).

In one embodiment which may be combined with one or more of the before-addressed embodiments, said device comprises an optics member, wherein said optics member is an optics member manufactured by manufacturing a multitude of optics members arranged on a wafer referred to as optics wafer, said multitude of optics members including said optics member.

In one embodiment referring to the last-addressed embodiment, said spacer wafer, in order to at least partially accomplish said compensating, is manufactured to exhibit one or more generally laterally extended regions in which the spacer wafer describes a generally curved shape, each of said one or more regions extending across an area as large as an area taken in said optics wafer by several of said multitude of optics members, in particular wherein said spacer wafer exhibits exactly one such region, more particularly, wherein said one region extends substantially across the whole spacer wafer. These and also below-mentioned "generally laterally extended regions" can also be considered "laterally defined regions", since they are defined by their lateral position and extension. This is a way of embodying the second sub-aspect.

In one embodiment referring to one or both of the two last-addressed embodiments, said spacer wafer is manufactured to be generally wedge-shaped or to exhibit a general tilt, more particularly a tilt with respect to a lateral plane of the spacer wafer. Also this is a way of embodying the second sub-aspect.

In one embodiment which may be combined with one or more of the three last-addressed embodiments, said spacer wafer is manufactured to comprise a multitude of generally laterally extended regions, each of said multitude of regions being associated with one of said multitude of optics members. A vertical extension of the spacer wafer in each of said regions is selected in dependence of at least one property of the respective associated optics member. Said at least one property may comprises a focal length. In particular, it may be provided that said spacer wafer is manufactured using a replication step, wherein a replication master used in said replication step is designed for at least partially compensating for said manufacturing irregularities. This is a way of embodying the third sub-aspect.

In one embodiment which may be combined with one or more of the before-addressed embodiments, said spacer wafer comprises a first layer and a second layer which are made of mutually different materials. E.g., said second layer is made of a polymer material. And it may be provided that material is removed from said second layer (in particular in the before-addressed generally laterally extended regions), but not from said first layer. Said first layer may in particular be made of a (different) polymer or of glass. It can be provided that said first and second layers form two mutually adhering plates.

In one embodiment which may be combined with one or more of the before-addressed embodiments, the method comprises carrying out a first processing step and carrying out subsequently to said first processing step a second processing step different from said first processing step. Said first and second processing steps can more specifically be steps for removing material from the spacer wafer or for adding material to the spacer wafer. It can in particular be provided that said first processing step differs from said second processing step in at least one of an applied processing technique;
a tool used in the respective processing step;
at least one processing parameter used in the respective processing step.

E.g., said first processing step is carried out at a higher rate of removal of material from (or higher rate of adding material to) a plurality of said multitude of regions than said second processing step. The second step may, e.g., be considered a fine-tuning step.

The first processing step may also be applied to different (laterally defined) regions than the second processing step. This may be particularly useful in case of multi-channel devices.

In one embodiment which may be combined with one or more of the before-addressed embodiments, said spacer wafer is manufactured to comprise a multitude of generally laterally extended regions, said spacer wafer comprising in each of said multitude of generally laterally extended regions a passive optical component (e.g., a lens) made of a replication material. And said correction step comprises manufacturing said multitude of passive optical components using replication, wherein each of said multitude of passive optical components is replicated on a substrate of said spacer wafer together with an additional portion of said replication material forming a layer of replication material located between said substrate and the respective passive optical component. And a vertical extension of the respective layer of replication material in each of said regions is individually selected for the respective region. This embodiment may be considered to embody a local addition of material to said spacer wafer, but in a specific way. And optical path length and the relative position of optical components is changed when changing the thickness of such a layer of replication material. Said spacer wafer may be considered an optics wafer, since it comprises said passive optical components.

In one embodiment referring to the last-addressed embodiment, said device comprises an optics member, wherein said optics member is an optics member manufactured by manufacturing a multitude of optics members arranged on a wafer referred to as optics wafer, said multitude of optics members including said optics member, wherein each of said multitude of generally laterally extended regions is associated with one of said multitude of optics members. And in each of said regions, a vertical extension of the respective layer is related to or selected in dependence of at least one property of the respective associated optics member, said at least one property optionally comprising a focal length. In particular, a replication master used in replicating said passive optical components is designed for at least partially compensating for manufacturing irregularities of said optics members.

A Device, in a First View:

In a first view, a device is comprised in the invention which is manufactured according to a manufacturing method described in the present patent application. Such a device can be, e.g., an opto-electronic module, a module for a camera, a photographic device, a communication device such as a smart phone.

The invention comprises devices with features of corresponding methods according to the invention, and, vice versa, also methods with features of corresponding devices according to the invention.

The advantages of the devices basically correspond to the advantages of corresponding methods and, vice versa, the advantages of the methods basically correspond to the advantages of corresponding devices.

A Device, in a Second View:

In a second view, a device is comprised in the invention which comprises a first wafer referred to as optics wafer and a second wafer referred to as spacer wafer, said optics wafer having manufacturing irregularities, said spacer wafer at least partially compensating for said manufacturing irregularities. The device can in particular be a wafer stack.

In one embodiment of the device, said spacer wafer comprises a first layer and a second layer which are made of mutually different materials, in particular wherein said second layer is made of a polymer material and/or said first layer is made of glass, or, e.g., different polymers are used for the first and second layers.

In one embodiment referring to the last-addressed embodiment, said optics wafer comprises a multitude of optics members, and said spacer wafer comprises a multitude of generally laterally extended regions, each of said multitude of regions being associated with one of said multitude of optics members. And a vertical extension of said second layer in each of said regions is related to or selected in dependence of at least one property of the respective associated optics member, in particular wherein said at least one property comprises a focal length. Therein, it may be provided that a vertical extension of said first layer is substantially identical for each of said regions.

It may furthermore be provided that said spacer wafer is manufactured using a replication step and/or that said spacer wafer is made of a hardened hardenable material such as a curable polymer.

In one embodiment which may be combined with one or more of the before-addressed embodiments, said spacer wafer forms a multitude of light channels. In particular, each of said multitude of light channels is surrounded by channel walls formed by said spacer wafer. If said channel walls are made of a non-transparent material, an at least partial optical isolation of light channels can be achieved. But in general, the channel walls might also be made of transparent material.

It can furthermore be provided that in one or more of said multitude of light channels (in particular in each of said multitude of light channels) a transparent material is present. Light passing through a light channel thus passes through said transparent material. An optical path length through a liquid or rather solid transparent material will usually be different from an optical path length through a "normal" ("unfilled") opening—in which typically vacuum or air is present). Thus, for accomplishing or at least contributing to a compensation of said manufacturing irregularities, an amount of said transparent material present in a first of said multitude of light channels can be selected to be different from an amount of said transparent material present in at least a second one of said multitude of light channels.

It is possible to manufacture wafers by replication which comprise a multitude of channel walls surrounding openings; such a wafer can, e.g., be shaped like a flat sieve with prismatic or tubular openings. It can furthermore be provided that said transparent material is a hardened hardenable material. This way, it can be filled into the channels in liquid form and hardened afterwards. The transparent material present in one of said multitude light channels may in particular fill the respective channel completely along a vertically defined range, in particular wherein said vertically defined range ends at an end of said respective channel.

It is furthermore possible to provide transparent material in light channels, in analogy to the before-explained three sub-aspects, in (at least) three ways:

(nominally) identical amount or thickness of said transparent material in all light channels;

the amount or thickness of said transparent material in the light channels describes a general trend across the spacer wafer;

the amount or thickness of said transparent material in the light channels is individually chosen for a multitude of regions of the spacer wafer, e.g., individually for each spacer member or optics member.

Note that if said optics wafer comprises a multitude of optics members, each of said light channels will usually be associated with one of said optics members.

In one embodiment which may be combined with one or more of the before-addressed embodiments, said spacer wafer comprises a multitude of generally laterally extended regions and a substrate extending throughout all of said generally laterally extended regions, wherein said spacer wafer comprises in each of said multitude of generally laterally extended regions a passive optical component (e.g., a lens). And in each of said multitude of generally laterally extended regions, a layer of material is present between said substrate and the respective passive optical component, wherein a vertical extension of the respective layer in each of said regions is individually selected for the respective region. Therein, it can in particular be provided that said layers are made of the same material as the passive optical components, and more particularly, each of said layers may form a unitary part together with the respective passive optical component. Furthermore, it may be provided that said passive optical components are made of a replication material and/or manufactured using replication. If the passive optical components are manufactured simultaneously, in one step, with the respective associated layer of material, a compensation for said manufacturing irregularities can be achieved with very little effort only.

In one embodiment referring to the last-addressed embodiment, said optics wafer comprises a multitude of optics members, wherein each of said multitude of optics members is associated with one of said multitude of generally laterally extended regions, and wherein in each of said regions, a vertical extension of the layer in the respective region is related to or selected in dependence of at least one property of the respective associated optics member, in particular wherein said at least one property comprises a focal length.

In one embodiment which may be combined with one or more of the before-addressed embodiments, said optics wafer is manufactured using a replication step and/or it is made of a hardened hardenable material (in particular a cured curable material) with features of corresponding methods according to the invention.

The invention comprises methods with features of corresponding devices according to the invention, and, vice versa, also devices with features of corresponding methods according to the invention.

The advantages of the methods basically correspond to the advantages of corresponding devices and, vice versa, the advantages of the devices basically correspond to the advantages of corresponding methods.

Further embodiments and advantages emerge from the claims and the figures.

BRIEF DESCRIPTION OF THE DRAWINGS

Below, the invention is described in more detail by means of examples and the included drawings. The figures show in a strongly schematized manner.

The described embodiments are meant as examples and shall not confine the invention.

DETAILED DESCRIPTION OF THE INVENTION

Figure 1:
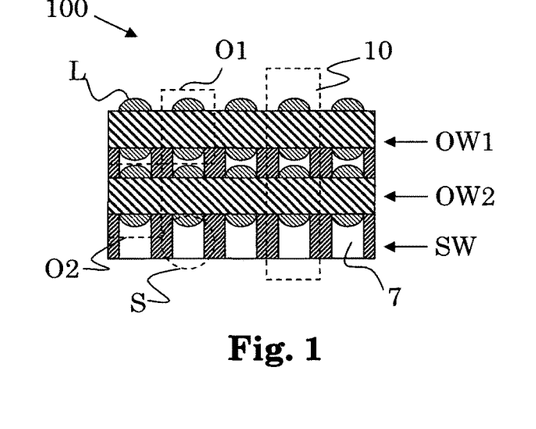
FIG. 1 an illustration of a first sub-aspect of the invention, in a cross-sectional view.
Figure 2:
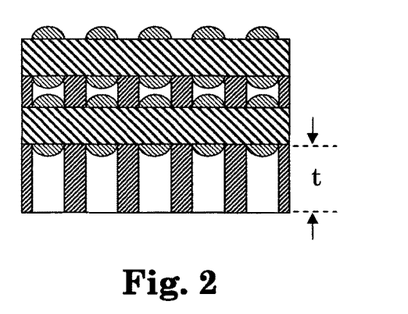
FIG. 2 an illustration of a first sub-aspect of the invention, in a cross-sectional view.

FIGS. 1 and 2 are schematic illustrations of the before-addressed first sub-aspect of the invention, in a cross-sectional view.

A wafer stack or a detail of a wafer stack 100 is shown in FIGS. 1 and 2, comprising a spacer wafer SW and two optics wafers OW1 and OW2. A multitude of devices 10 can be obtained from such a wafer stack 100, each comprising a spacer member S and two optics members O1, O2.

Figure 3:
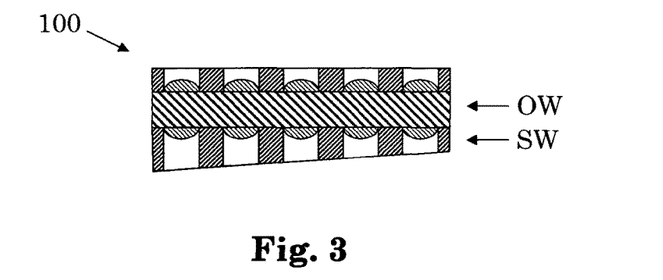
FIG. 3 an illustration of a second sub-aspect of the invention, in a cross-sectional view.

As will be illustrated in FIG. 3, it is well possible that only one optics wafer (referenced OW) is present.

Each optics member comprises at least one passive optical component L, e.g., a lens element L, in the example of FIGS. 1 and 2, four lens elements L per device 10, two per each of the optics members O1 and O2. The spacer members S can be used for ensuring a well-defined distance of the optics members and/or the at least one passive optical component L to another device or member, e.g., when the optics member(s) shall be fixed to said other device or member. Therein, said distance is usually of great importance, in particular considering a characteristic magnitude such as a focal length of the components or elements L.

E.g., for manufacturing reasons, it can occur that the focal lengths of (the set of) passive optical components L is not identical for each device 10.

The spacer wafer SW can help to remedy such problems.

E.g., an average value of focal lengths of a plurality of devices 10 can be determined. And, if this average value deviates (to a sufficiently large extent) from a nominal value, a spacer wafer of a thickness t can be used which is particularly appropriate in presence of that deviation. This is illustrated in FIGS. 1 and 2: In FIG. 2, a thicker wafer is used, in order to compensate for a corresponding deviation in (average) focal length.

It is possible to pre-fabricate spacer wafers of different thicknesses (i.e. vertical extensions) and to select one of these, in dependence of a determined (average) deviation to be compensated for. Or, a spacer wafer of suitable thickness is specifically produced.

Spacer wafers SW can readily be produced using replication or even by means of replication.

Spacer wafers SW can be made, partially or in full, of a non-transparent material. The provision of non-transparent material can inhibit undesired propagation of light out of or into a device 10.

FIG. 3 illustrates, in the same manner as FIGS. 1 and 2, the before-addressed second sub-aspect of the invention.

Here, a general trend in the deviations of focal lengths has been observed, which therefore is compensated using a spacer wafer SW of varying thickness, e.g., being generally wedge-shaped or having a generally wedge-shaped profile.

Such a spacer wafer SW can, e.g., be fabricated using polishing.

Of course, also more complicated trends or distributions of focal lengths other characteristic magnitudes across the wafer can be compensated for, e.g., curved shapes, shapes having several mutually inclined planes, or others.

Figure 4:
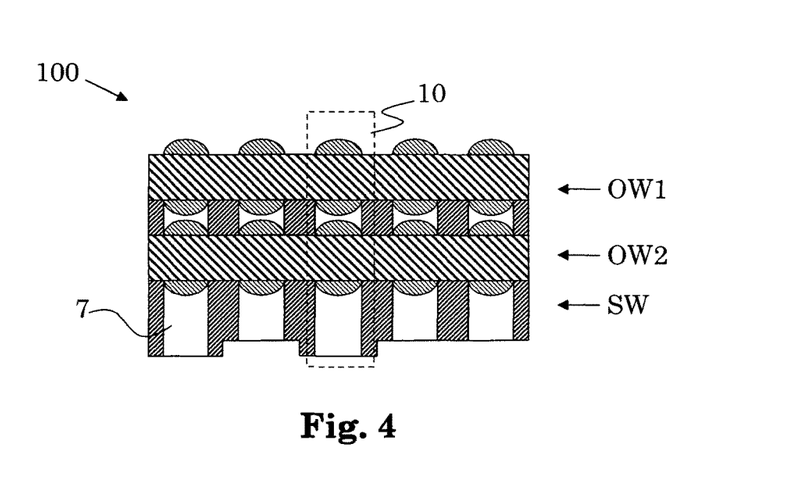
FIG. 4 an illustration of a third sub-aspect of the invention, in a cross-sectional view.

FIG. 4 illustrates, in the same manner as FIGS. 1, 2 and 3, the before-addressed third sub-aspect of the invention.

Here, for each device 10, the length of a light channel 7 through the spacer wafer is individually adjusted in order to at least partially compensate for deviations (manufacturing irregularities) of the passive optical components of the respective device.

This can be accomplished by removing material from the spacer wafer, e.g., by machining or milling or drilling or by laser ablation. Usually, the deviation from the nominal value (nominal focal length) will be determined for each device (before a separation of wafers into devices 10), and the machining or milling or drilling or laser ablating will then be individually applied, before the spacer wafer is separated.

It is also possible to increase the length of a light channel 7 of a spacer wafer or to locally increase a thickness of a spacer wafer. This may be accomplished by (locally) adding material to the spacer wafer, e.g., by means of ink jet technology.

Figure 5:
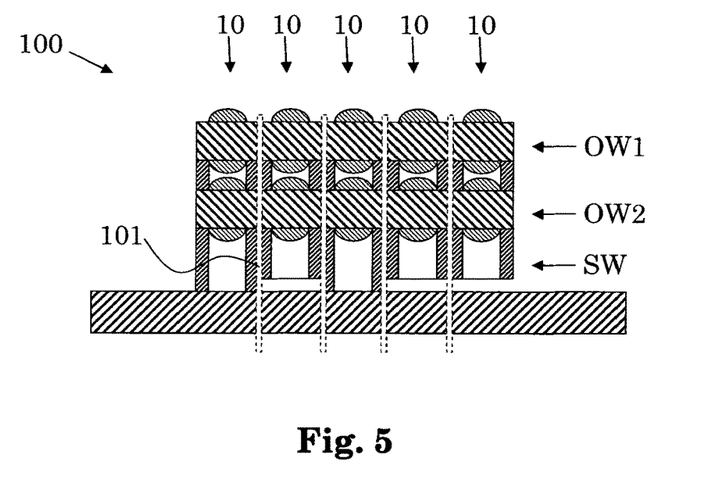
FIG. 5 an illustration of a separation step, in a cross-sectional view.

FIG. 5 illustrates a separation step by means of which a wafer stack is separated into individual devices 10. Separation takes place along the lines referenced 101.

Figure 6:
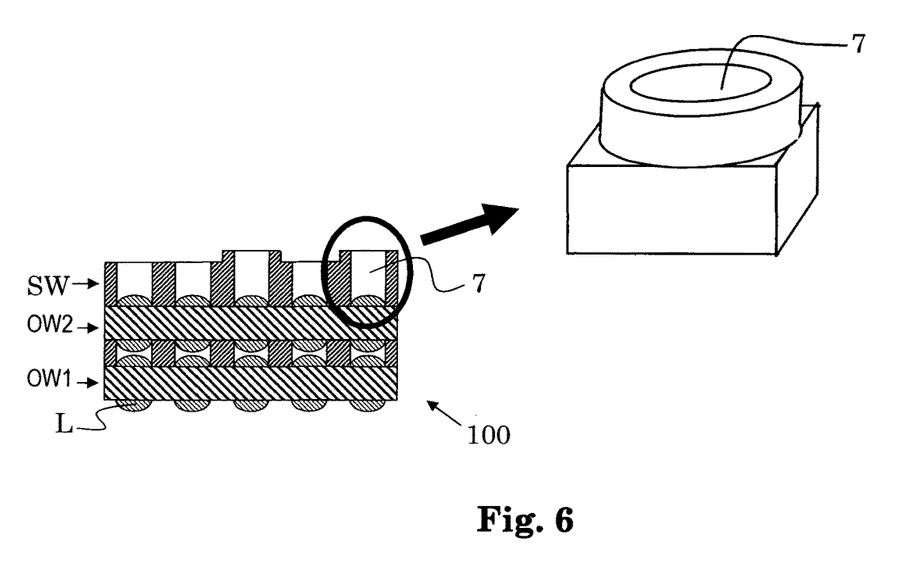
FIG. 6 an illustration of a particular embodiment of the third sub-aspect of the invention, in a cross-sectional view.

FIG. 6 illustrates a particular embodiment of the third sub-aspect (cf. also FIG. 4). The spacer wafer SW has a particular shape in this case. This particular shape can facilitate the local decreasing of thickness of the spacer wafer SW, in particular when rotating tools are used in the thickness decreasing, e.g., when accomplished by machining or milling or drilling. Manufacturing a spacer wafer SW having such a geometry can, e.g., be accomplished using replication. The right portion of FIG. 6 illustrates, in a perspective view, a portion of a spacer wafer, more particularly a portion of a spacer wafer as it would look after a separating step, in particular wherein in that separating step, the wafer stack comprising the spacer wafer is separated into a multitude of single devices 10.

As illustrated in the right portion of FIG. 6, the spacer wafer has, at one side (more particularly at that one side facing, in the wafer stack 100, away from the lens elements L and thus from optics wafer OW2), a multitude of ring-shaped portions, e.g., one for each device. The height adjustments (accomplished by removal of material) are accomplished at this side and, more particularly, at these ring-shaped portions.

In FIGS. 1, 2, 4, 5, 6, between the two optics wafers OW1, OW2, another wafer is present such as another spacer wafer, or the corresponding structure can be comprised in one of the optics wafers OW1, OW2.

The manufacturing of the one or more optics wafers may be accomplished using replication, in particular the manufacturing of the one or more passive optical components L (lens elements L) may be accomplished using replication or by means of replication.

Figure 7:
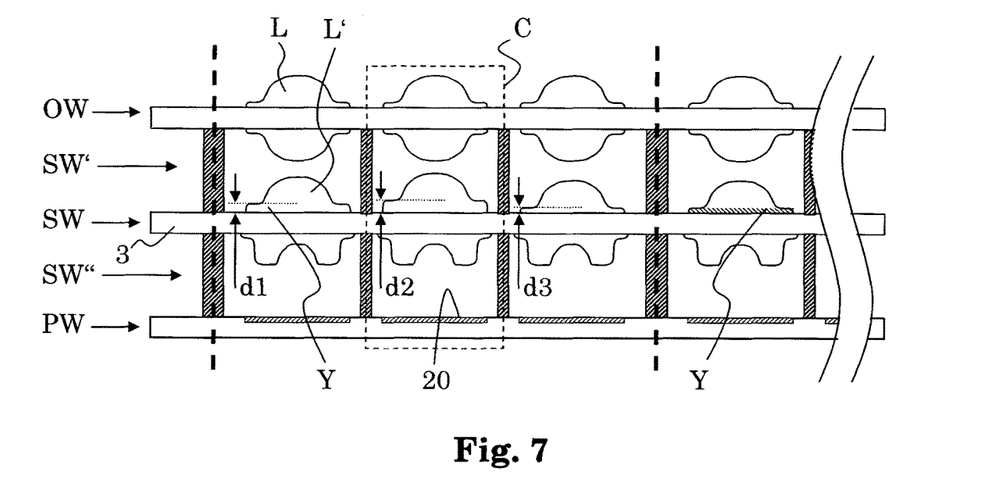
FIG. 7 an illustration of another particular embodiment of the third sub-aspect of the invention, in a cross-sectional view.

FIG. 7 is an illustration of another particular embodiment of the third sub-aspect of the invention, in a cross-sectional view. In this embodiment, manufacturing irregularities in one or more passive optical components comprised in an optics wafer are compensated for in the manufacturing of one or more other passive optical components. More particularly:

In this embodiment, manufacturing irregularities in a first passive optical component (more particularly lens element L) are compensated for in the manufacturing of a second passive optical component (more particularly lens element L'), in particular wherein said second passive optical component is, during its manufacture, comprised in a wafer different from the wafer in which said first passive optical component is comprised during its manufacture.

FIG. 7 schematically shows a portion of a wafer stack 100 comprising an optics wafer OW, a wafer SW which, for improved compatibility with the wording used throughout the present patent application, will be referred to as spacer wafer SW, even though it could rather be referred to as (another) optics wafer, a substrate wafer PW, and a spacer wafer SW' between optics wafer OW and spacer wafer SW (for defining a vertical distance between these), and a spacer wafer SW" between substrate wafer PW and spacer wafer SW (for defining a vertical distance between these).

Optics wafer OW comprises passive optical components L and, optionally, as illustrated in FIG. 7, further passive optical components on its opposite face. Spacer wafer SW comprises passive optical components L' and, optionally, as illustrated in FIG. 7, further passive optical components on its opposite face. Substrate wafer PW may comprise light detecting elements 20 such as multi-pixel detectors, e.g., image detectors, for detecting light having passed through the passive optical components of wafers OW and SW.

Wafer stack 100 of FIG. 7 may be used for manufacturing multi-channel devices, e.g., for array cameras or computational cameras. In this case, separation of wafer stack 100 into individual devices could take place along the thick dashed vertical lines, and corresponding devices might be, e.g., 9-channel devices having a 3×3 channel array. But it is readily understood, what the embodiment illustrated in FIG. 7 would look like in order to obtain single-channel devices, cf. also the single channel C depicted by means of the dotted rectangle.

If we assume that lens element L is of particular importance for the overall focal length of each channel (the focal length being an example for a characteristic magnitude to be adjusted in order to remedy manufacturing irregularities), it is possible to compensate deviations of individual lens elements L on spacer wafer SW, more particularly during the manufacture thereof, and even more particularly during the manufacture of lens element L'. Namely in the following way:

For each individual lens element L, a deviation from a desired (nominal) focal length value can be determined, and therefrom, a thickness of a layer Y of material between a substrate 3 of spacer wafer SW and a respective lens element L' can be determined which is suitable for compensating that deviation. Varying such a thickness can do so because it effects a variation of the optical path length in the respective channel.

Such a method can be particularly useful when at least one of lenses L and L', in particular when both, lenses L and lenses L' are manufactured using replication. For example:

If lenses L are produced using a replication tool structured for manufacturing a multitude of lenses L, it is likely that deviations in the shape of individual lenses L occur always in approximately the same way in the same position on wafer OW, because shape imperfections in the replication tool can be a major source for such imperfections. Knowledge about the deviations can then be used in the manufacture of the lenses L'. Lenses L' are produced on substrate 3 by replication, wherein each lens L' is manufactured in one and the same replication process (and thus simultaneously) with a layer Y, namely such that a thickness of each individual layer is adjusted to compensate for said imperfections of the corresponding lens L (of the same channel). This can be accomplished in high precision when using a replication tool for manufacturing a multitude of lenses L'. In FIG. 7, three different thicknesses d1, d2, d3 for three different channels are illustrated.

In other words: Knowledge about the deviations from a nominal value of lens elements L can be used in the manufacture of a replication tool for manufacturing a multitude of lenses L', namely a replication tool providing that layers Y of individually selected layer thicknesses d (d1, d2 , d3) are produced when using the replication tool. These thicknesses d1, d2, d3 are suitably selected for compensating said deviations (manufacturing irregularities) of lenses L Of course, it is also possible to use one or more other passive optical components of a channel for such a compensation, and it is also possible to compensate for manufacturing irregularities of one or more other passive optical components of a channel.

It is to be noted that the passive optical components illustrated in FIG. 7 may be refractive ones (as actually illustrated), but one or more of them may as well be diffractive ones or diffractive and refractive ones. And they do not necessarily need to be lenses.

It is furthermore to be noted that substrate wafer PW is, in general, optional. In that case, it can even be possible to dispense with spacer wafer SW" (and the anyway optional passive optical components present on spacer wafer SW on the face opposite to the face where passive optical components L' are present).

Figure 8:
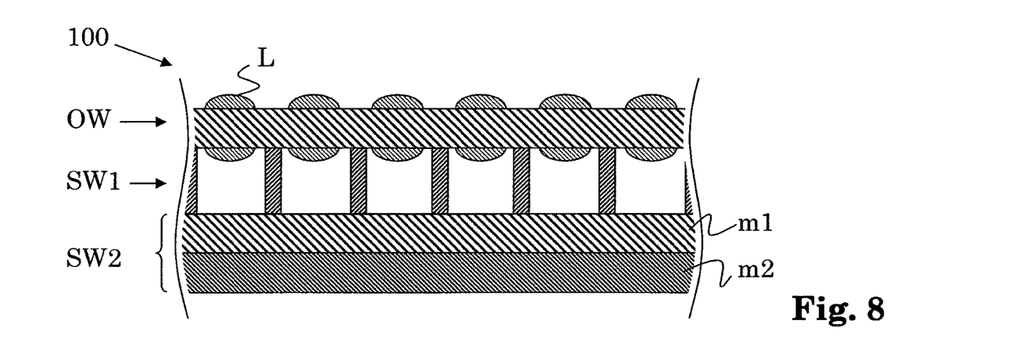
FIG. 8 an illustration of aspects of the invention, in a cross-sectional view.
Figure 9:
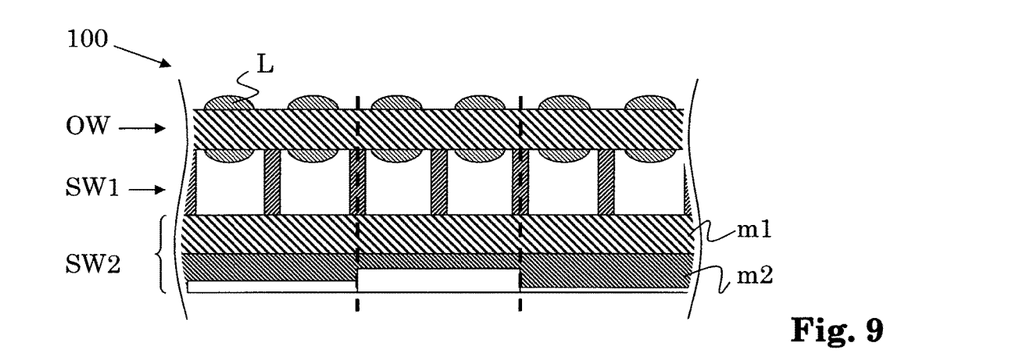
FIG. 9 an illustration of aspects of the invention, in a cross-sectional view.
Figure 10:
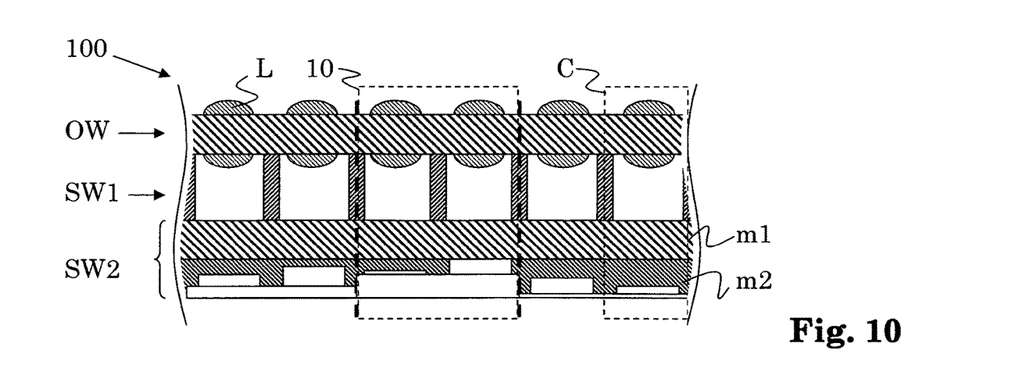
FIG. 10 an illustration of aspects of the invention, in a cross-sectional view.

FIGS. 8 to 10 illustrate further possible aspects and embodiments of the invention.

FIGS. 8 to 10 illustrate, in a cross-sectional view, a wafer stack 100 comprising an optics wafer OW comprising passive optical components L at least a portion of which have manufacturing irregularities such as focal lengths deviating from a nominal value, a spacer wafer SW2, and a spacer wafer SW1 for ensuring a desired (vertical) distance between optics wafer OW and spacer wafer SW2. One particularity of the wafer stack is that spacer wafer SW2 comprises two layers m1, m2 of different (but transparent) materials. E.g., layer m1 is made of glass, and layer m2 is made of a polymer; or two different polymer materials can be used for the layers m1, m2. It can, more generally, be provided that the layer (m1) facing optics wafer OW is provided for providing mechanical stability, whereas the other layer (m2) (more particular, the material of which it is made) is mechanically less stable than (the material of) layer m1. And/or, it can be provided that, considering a method or process for removing material from spacer wafer SW2, the material of layer m2 is easier to remove than the material of layer m1.

It is also possible to look upon spacer wafers SW1 and SW2 as one spacer wafer. And it is also possible to consider layers m1 and m2, respectively, as distinct spacer wafers.

More specifically, as illustrated in FIGS. 9 and 10, it is possible to provide that a removal of material for compensating for manufacturing irregularities of optics wafer OW takes place in layer m2 only.

Furthermore, FIGS. 8 to 10, and more specifically, FIGS. 9 and 10, illustrate that it is possible to carry out a removal of material from a spacer wafer SW (or, more specifically from a layer m2) in two (or generally: two or more) processing steps. In this case, FIG. 9 illustrates the wafer stack resulting from applying a first processing step to the wafer stack 100 of FIG. 8, and FIG. 10 illustrates the wafer stack resulting from applying a second processing step to the wafer stack 100 of FIG. 9. E.g., if both processing steps are carried out by means of milling, in the first processing step, a different milling tool may be used and possibly also a faster feed rate than in the second processing step may be applied. And it is also possible to combine different processing techniques in the processing steps, e.g., laser ablation first, and milling thereafter, or vice versa.

The second processing step may in particular be a fine-tuning step (for the local thickness of spacer wafer SW2).

And even further, FIGS. 9 and 10 may be looked upon as illustrating a possible way of proceeding in case of multi-channel devices, such as four-channel devices with a 2×2 array of channels (cf. FIGS. 9 and 10). As illustrated in FIG. 9, it is possible to carry out the first processing step individually for one device 10, but carry out the second processing step individually for each channel C (cf. FIG. 10).

Figure 11:
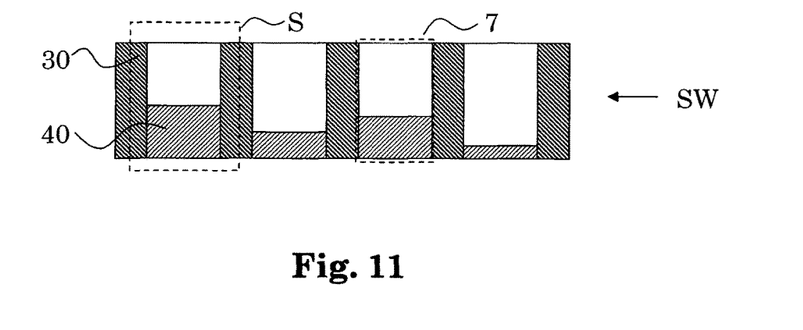
FIG. 11 an illustration of aspects of the invention, in a cross-sectional view.

FIG. 11 illustrates further potential aspects of the invention. In a cross-sectional view, a spacer wafer SW (or a portion thereof) is illustrated which comprises several spacer members S. The spacer members S comprise light channels 7 surrounded by channel walls 30 which can be made of non-transparent material (usually for optical isolation). The light channels 7 are partially filled with a solid transparent material 40, e.g., a curable polymer.

For obtaining a spacer wafer SW like illustrated in FIG. 11, a wafer comprising a multitude of through-holes may be provided, e.g., a wafer shaped like a sieve, e.g., merely consisting of the channel walls 30. Such a wafer can be obtained, e.g., as a unitary part, e.g., using a replication process. Then, a liquid hardenable material is filled into the through holes and is thereafter hardened, e.g., cured. During this, said wafer can be placed on a substrate such as on a mat of a silicone in order to avoid liquid material flowing out of the through-holes. After hardening, the filled-in material is transparent material 40. Possibly, a polishing step may be applied to the so-obtained wafer, in order to have high-quality optical surfaces.

In one way of obtaining a spacer wafer SW like illustrated in FIG. 11, the amount of liquid material filled in the holes is selected individually for each light channel 7, so as to accomplish an adjustment of optical path lengths for achieving or improving a sought compensation of manufacturing irregularities. In another way, the amount of material filled in is (at least nominally) equal for all light channels (such as for all through-holes) of a spacer wafer. After hardening, then, a processing step is carried out, for adding more of a (or of the same) liquid hardenable material individually for the light channels and/or for removing a portion of said liquid hardenable material individually for the light channels. Such a fine-tuning step, however, can also be applied in case of the before-addressed first way.

For filling-in liquid material, e.g., a dispenser (like known from electronics manufacturing for underfilling flip chips and the like) may be used. For removing material, machining or milling or drilling or laser ablation may be used.

A provision of transparent material in light channels 7 may, by itself, accomplish a compensation of manufacturing irregularities, because an optical path length for light passing through a light channel usually depends on the amount or vertical extension of the transparent material, at least in case of a refractive index (clearly) larger than one of the transparent material. It is, however, also possible to combine a provision of transparent material in light channels 7 with a provision of different geometrical lengths of light channels 7. In the latter case, one of the two types of provisions may be accomplished after the other one, e.g., as a fine-tuning, for optimizing a sought compensation of manufacturing irregularities.

As will have become clear from the above, the invention may allow to mass produce high-precision optical devices on wafer scale at a very high yield.

The invention claimed is:

1. A method for manufacturing a device, said method comprising:
   carrying out a correction step comprising manufacturing a spacer wafer, the spacer wafer including a multitude of regions in a plane, each of which has a respective vertical extension perpendicular to the plane;
   said spacer wafer comprising a first layer and a second layer which are made of different materials and which are vertically stacked one upon the other, each of said first layer and said second layer having a shape of a contiguous disk extending throughout each said multitude of regions;
   wherein the manufacturing comprises, after an initial formation of the spacer wafer, decreasing a length of respective ones of said vertical extensions in a plurality of said multitude of regions so as to compensate at least partially for manufacturing irregularities in another device when the spacer wafer is combined with the other device, the spacer wafer being distinct from the other device, wherein said decreasing said vertical extension comprises carrying out a first processing step and carrying out subsequently to said first processing step a second processing step different from said first processing step in at least one aspect, and wherein said vertical extension is decreased both in said first processing step and in said second processing step, and wherein said decreasing the length is accomplished by removal of material from said second layer only.

2. The method according to claim 1, wherein said first processing step differs from said second processing step in an applied processing technique.

3. The method according to claim 1, wherein said first processing step differs from said second processing step in a tool used in the respective processing step.

4. The method according to claim 1, wherein said first processing step differs from said second processing step in at least one processing parameter used in the respective processing step.

5. The method according to claim 1, the method comprising decreasing said vertical extension in said plurality of said multitude of regions by removing material in said plurality of said multitude of regions.

6. The method according to claim 1, wherein said first processing step is carried out at a higher rate of removal of material from said plurality of said multitude of regions than said second processing step.

7. The method according to claim 1, wherein said decreasing said vertical extension is accomplished using cutting or machining.

8. The method according to claim 7, wherein said cutting or machining is individually applied to each of said plurality of regions.

9. The method according to claim 1, wherein said decreasing said vertical extension is accomplished using milling or using a milling tool.

10. The method according to claim 9, wherein said milling or said milling tool is individually applied to each of said plurality of regions.

11. The method according to claim 1, wherein said decreasing said vertical extension is accomplished using laser ablating.

12. The method according to claim 11, wherein said laser ablating is individually applied to each of said plurality of regions.

13. The method according to claim 1, wherein said device being manufactured is an optical device.

14. The method according to claim 1, wherein said manufacturing irregularities comprise a deviation from a nominal value of an optical property of said other device.

15. The method according to claim 1, wherein said spacer wafer is manufactured using replication, wherein a replication master used in said replication is designed for at least partially compensating for said manufacturing irregularities.

16. The method according to claim 1 wherein the other device is another wafer.

17. The method of claim 1 wherein each of the first and second processing steps includes at least one of removing material from the spacer wafer or adding material to the spacer wafer.

18. The method of claim 2 wherein each of the first and second processing steps includes at least one of removing material from the spacer wafer or adding material to the spacer wafer.

19. The method of claim 3 wherein each of the first and second processing steps includes removing material from the spacer wafer.

20. A method for manufacturing a device, said method comprising:
performing a correction step comprising manufacturing a spacer wafer, said spacer wafer including a multitude of regions defining a multitude of corresponding channels that are parallel to one another, each of the channels having a respective length defined by an extension of a respective one of the regions in a direction parallel to the channels;
said spacer wafer comprising a first layer and a second layer which are made of different materials and which are vertically stacked one upon the other, each of said first layer and said second layer having a shape of a contiguous disk extending throughout each of said multitude of regions;
wherein the manufacturing comprises, after an initial formation of the spacer wafer, decreasing a length of respective ones of said extensions in a plurality of said multitude of said regions so as to compensate at least partially for manufacturing variations in one or more other devices when the spacer wafer is combined with the one or more other devices, the spacer wafer being distinct from the one or more other devices, wherein said decreasing comprises performing, in each of said plurality of said multitude of said regions, a first processing step and subsequently performing a second processing step that differs from the first processing step in at least one aspect and
wherein said decreasing the length is accomplished by removal of material from said second layer only.

21. The method of claim 20 wherein the first processing step differs from the second processing step in one or more of: an applied processing technique, a tool used in the respective processing step, or a processing parameter used in the respective processing step.

22. The method of claim 20 wherein each of the first and second processing steps includes removing material from the spacer wafer.

23. A method for manufacturing a device, said method comprising:
performing a correction step comprising manufacturing a spacer wafer, said spacer wafer including a multitude of regions defining a multitude of corresponding channels that are parallel to one another, each of the channels having a respective length defined by an extension of a respective one of the regions in a direction parallel to the channels;
said spacer wafer comprising a first layer and a second layer which are made of different materials and which are vertically stacked one upon the other, each of said first layer and said second layer having a shape of a contiguous disk extending throughout each of said multitude of regions;
wherein the manufacturing comprises, after an initial formation of the spacer wafer, decreasing a length of respective ones of said extensions in a plurality of said multitude of said regions so as to compensate at least partially for manufacturing variations in one or more other devices when the spacer wafer is combined with the one or more other devices, the spacer wafer being distinct from the one or more other devices, wherein said decreasing comprises performing, in each of said plurality of said multitude of said regions, a first processing step and subsequently performing a second processing step that differs from the first processing step in at least one aspect, and
wherein said decreasing the length is accomplished by removal of material from said second layer only;
the method further comprising attaching the spacer wafer to another wafer comprising the one or more other devices.

24. The method of claim 23 wherein each of the one or more other devices comprises at least one passive optical component.

25. The method of claim 24 wherein each of the passive optical components comprises a lens.

26. The method of claim 23 wherein the manufacturing comprises decreasing the length of said respective ones of said extensions in said plurality of said regions so as to compensate at least partially for manufacturing variations in a focal length of one or more of the other devices when the spacer wafer is combined with the one or more other devices.

27. The method of claim 23 wherein each of the first and second processing steps includes at least one of removing material from the spacer wafer or adding material to the spacer wafer.

28. The method of claim 1 wherein the first processing step is applied to sections of the spacer which are different from sections of the spacer wafer to which the second processing is applied.

29. The method of claim 1 wherein the first processing step is applied to first sections of the spacer wafer and the second processing step is applied to second sections of the spacer wafer, wherein the second sections are different from and comprised within the first sections.

30. The method of claim 1 wherein the device is a multi-channel device comprising a plurality of channels, and wherein the first processing step is applied simultaneously to the plurality of channels, and the second processing step subsequently is applied individually to each of the plurality of channels.

31. The method of claim 20 wherein the first processing step is applied to sections of the spacer wafer which are different from sections of the spacer wafer to which the second processing is applied.

32. The method of claim 20 wherein the first processing step is applied to first sections of the spacer wafer and the second processing step is applied to second sections of the spacer wafer, wherein the second sections are different from and comprised within the first sections.

33. The method of claim 20 wherein the device is a multi-channel device comprising a plurality of said multitude of corresponding channels, and wherein the first processing step is applied simultaneously to said plurality of said multitude of the corresponding channels, and the second processing step subsequently is applied individually to each of said plurality of said multitude of corresponding channels.

34. The method of claim 23 wherein the first processing step is applied to sections of the spacer wafer different from sections of the spacer wafer to which the second processing is applied.

35. The method of claim 23 wherein the first processing step is applied to first sections of the spacer wafer and the second processing step is applied to second sections of the spacer wafer, wherein the second sections are different from and comprised within the first sections.

36. The method of claim 23 wherein the device is a multi-channel device comprising a plurality of said multitude of corresponding channels, and wherein the first processing step is applied simultaneously to said plurality of said multitude of corresponding channels, and the second processing step subsequently is applied individually to each of said plurality of said multitude of corresponding channels.

37. The method of claim 1 wherein said second layer is made of a polymer material, and said first layer is made of glass.

38. The method of claim 20 wherein said second layer is made of a polymer material, and said first layer is made of glass.

39. The method of claim 23 wherein said second layer is made of a polymer material, and said first layer is made of glass.

* * * * *